United States Patent
Patapoutian et al.

(10) Patent No.: US 9,130,596 B2
(45) Date of Patent: Sep. 8, 2015

(54) MULTIUSE DATA CHANNEL

(75) Inventors: Ara Patapoutian, Hopkinton, MA (US); Hieu V. Nguyen, Superior, CO (US); Prafulla Bollampalli Reddy, Longmont, CO (US)

(73) Assignee: Seagate Technology LLC, Cupertino, CA (US)

( * ) Notice: Subject to any disclaimer, the term of this patent is extended or adjusted under 35 U.S.C. 154(b) by 378 days.

(21) Appl. No.: 13/172,457

(22) Filed: Jun. 29, 2011

(65) Prior Publication Data
US 2013/0007556 A1 Jan. 3, 2013

(51) Int. Cl.
*H03M 13/29* (2006.01)
*H03M 13/00* (2006.01)
H03M 13/09 (2006.01)
H03M 13/11 (2006.01)
H03M 13/15 (2006.01)

(52) U.S. Cl.
CPC ...... *H03M 13/2906* (2013.01); *H03M 13/6516* (2013.01); *H03M 13/6561* (2013.01); *H03M 13/09* (2013.01); *H03M 13/1102* (2013.01); *H03M 13/1515* (2013.01)

(58) Field of Classification Search
CPC ............ H03M 13/09; H03M 13/1102; H03M 13/1515; H03M 13/2906; H03M 13/6516; H03M 13/6561
USPC .......................................... 714/746, 758, 763
See application file for complete search history.

(56) References Cited

U.S. PATENT DOCUMENTS

| | | | | |
|---|---|---|---|---|
| 4,876,541 A | * | 10/1989 | Storer | 341/51 |
| 5,323,403 A | * | 6/1994 | Elliott | 714/757 |
| 5,706,103 A | * | 1/1998 | Matoba et al. | 358/426.03 |
| 5,867,721 A | * | 2/1999 | Leinwander et al. | 712/1 |
| 8,136,005 B1 | * | 3/2012 | Nazari et al. | 714/752 |
| 8,381,067 B2 | * | 2/2013 | Hathorn et al. | 714/758 |
| 8,656,250 B2 | * | 2/2014 | Gunnam et al. | 714/758 |
| 2003/0016745 A1 | * | 1/2003 | Park et al. | 375/240.03 |
| 2003/0193923 A1 | * | 10/2003 | Abdelgany et al. | 370/342 |
| 2007/0033369 A1 | * | 2/2007 | Kasama et al. | 711/170 |
| 2008/0036489 A1 | * | 2/2008 | Kelem et al. | 326/12 |

(Continued)

OTHER PUBLICATIONS

Bassato, G.; Ponchia, R.; Bassini, R.; Boiano, C., "A four-channel ADC on a VME board," Nuclear Science, IEEE Transactions on , vol. 37, No. 6, pp. 2185,2187, Dec. 1990.*

(Continued)

*Primary Examiner* — Cynthia Britt
(74) *Attorney, Agent, or Firm* — Cesari & Reed LLP; Kirk A. Cesari

(57) ABSTRACT

Presented is a data channel with selectable components, such as encoders or decoders. Also, data having different data signal characteristics can be processed through a data channel based on the data signal characteristics. Further, a data channel may have independent encoding path and an independent decoding path. For example, a first data transmission having first data signal characteristics may be processed via a data channel based on a first selected set of components of the data channel and a second data transmission having second data signal characteristics different than the first data signal characteristics may be processed via the data channel using a second selected set of components in the data channel. The first selected set of components may be different than the second selected set of components, but may share one or more common components.

22 Claims, 4 Drawing Sheets

(56) References Cited

U.S. PATENT DOCUMENTS

| | | | |
|---|---|---|---|
| 2009/0045989 A1* | 2/2009 | Esumi et al. | 341/58 |
| 2009/0178043 A1* | 7/2009 | Prasanna et al. | 718/102 |
| 2012/0243692 A1* | 9/2012 | Ramamoorthy | 381/22 |
| 2013/0173997 A1* | 7/2013 | Suzumura et al. | 714/773 |
| 2014/0136927 A1* | 5/2014 | Li et al. | 714/768 |

OTHER PUBLICATIONS

Vien Nguyen-Duy-Nhat; Hung Nguyen-Le; Chien Tang-Tan, "On the effect of phase noise and time-selective channel on OFDM transmission: SINR analysis," Advanced Technologies for Communications (ATC), 2012 International Conference on , vol., No., pp. 98,102, Oct. 10-12, 2012.*

IEEE 100 The Authoritative Dictionary of IEEE Standards Terms Seventh Edition Copyright © 2000 by the Institute of Electrical and Electronics Engineers, Inc. Published Dec. 2000.*

Microsoft Computer Dictionary Fifth Edition Published by Microsoft Press Copyright © 2002.*

Aktas, T.; Yilmaz, AO.; Aktas, E., "Practical Methods for Wireless Network Coding With Multiple Unicast Transmissions," Communications, IEEE Transactions on , vol. 61, No. 3, pp. 1123,1133, Mar. 2013.*

* cited by examiner

MULTIUSE DATA CHANNEL

SUMMARY

The present disclosure is generally related to data channels for transmitting or receiving data and error correcting capabilities associated with such a data channel. In one example, a system can include a first data storage medium having first data signal characteristics, a second data storage medium having second data signal characteristics, and a data channel including a selectable component that can be included for processing data in a first channel configuration and excluded for processing data in a second channel configuration. Further, a control circuit can select the selectable component to be included or excluded for processing data based on a determined channel configuration.

In another example, a device can include a data channel having a selectable component that can be included for processing data in a first channel configuration and excluded for processing data in a second channel configuration.

In yet another example, a circuit can comprise a data channel having selectable components and the data channel is adapted to process data having at least two different channel processing requirements.

DETAILED DESCRIPTION

In the following detailed description of the embodiments, reference is made to the accompanying drawings which form a part hereof, and in which are shown by way of illustration of specific embodiments. It is to be understood that other embodiments may be utilized and structural changes may be made without departing from the scope of the present disclosure.

As used herein, the term error correcting code (ECC) may refer to a circuit, integrated circuit, programmable controller, software module, or any combination thereof that can determine the accuracy of data and correct errors. ECC may be a cyclic-redundancy-code (CRC) or non-CRC. An inner ECC can act on a unit of data bits such as a sector or a portion of a page. An outer ECC, or outer code, can act on multiple inner ECCs such that when an inner ECC fails to correct an inner codeword, the outer code may correct the inner codeword by using information from other inner codewords. Further, an outer code can correct burst errors, which may be used to correct whole sectors or whole pages.

The ECC may include Reed-Solomon codes that may detect and correct multiple random errors. For example, a Reed-Solomon outer code can protect against multiple random errors in sectors and pages of a nonvolatile solid state memory, such as NAND Flash memory and the like. An example of an ECC that may be used with Flash memory may be a BCH code, which may be used to correct errors on a bit level.

A decoder or encoder may refer to a circuit, integrated circuit, programmable controller, software module, or any combination thereof that can include one or more ECCs that may decode or encode a codeword using ECC. A detector may identify bits as '1' or '0' independent of an ECC.

An error detecting code (EDC) may refer to a circuit, integrated circuit, programmable controller, software module, or any combination thereof that can check the accuracy of codewords. For example, an EDC may be implemented with an ECC such that the EDC is a second level of error detection that checks whether corrected codewords from the ECC are a miscorrection or not.

Figure 1:
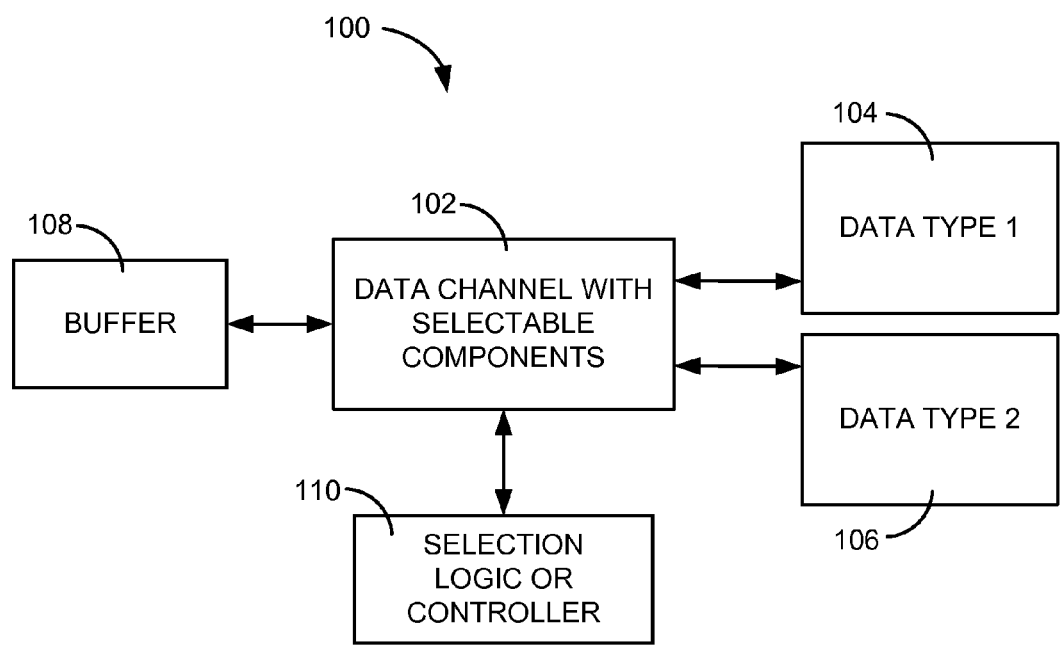
FIG. 1 is a diagram of an illustrative embodiment of a system for a multiuse data channel.

Referring to FIG. 1, a particular embodiment of a system for a multiuse data channel is shown and generally designated 100. The system 100 may include a data channel 102 with selectable components (hardware circuits, software modules, or a combination thereof) and selection logic 110, which may be a control circuit or controller adapted to implement selection of the selectable components based on one or more factors. The data channel 102 may be used for reading (i.e. receiving) and writing (i.e. transmitting) data, such as to a data storage medium, but may also be used in other applications for data channels, such as communications. In some situations, data having different signal characteristics can be processed through the data channel 102 and the selectable components may be selected based on signal characteristics associated with the data. Such signal characteristics may include different transmission methods, different data storage mediums, different compression types, different error correction capabilities, or other characteristics.

The system 100 may also include a buffer 108, a first data storage medium 104, and a second data storage medium 106. The first data storage medium 104 and the second data storage medium 106 may have different data signal characteristics, such as different data storage medium types, data density, types of data errors, data throughput, or other signal characteristics. For example the first data storage medium 104 may be a magnetic disc and the second data storage medium 106 may be a solid state data storage medium and in some instances may be a multi-level cell (MLC) NAND device. The reliability of an MLC NAND device may be improved by using sophisticated signal processing algorithms and error correcting codes (ECC), as discussed herein.

The selection logic 110 may select components of the data channel 102 based on the characteristics of the data or a data storage medium associated with the data. Different channel processing, such as ECC, may be needed due to different root causes of data errors. Some of the root causes of data errors may be based on a type of media, such as a magnetic disc or a MLC Flash; however, some of the components of the data channel 102 used to recover or correct bit errors could be similar for multiple systems. Thus, some of the channel encoding and decoding components could be used for data with different signal characteristics.

Figure 4:
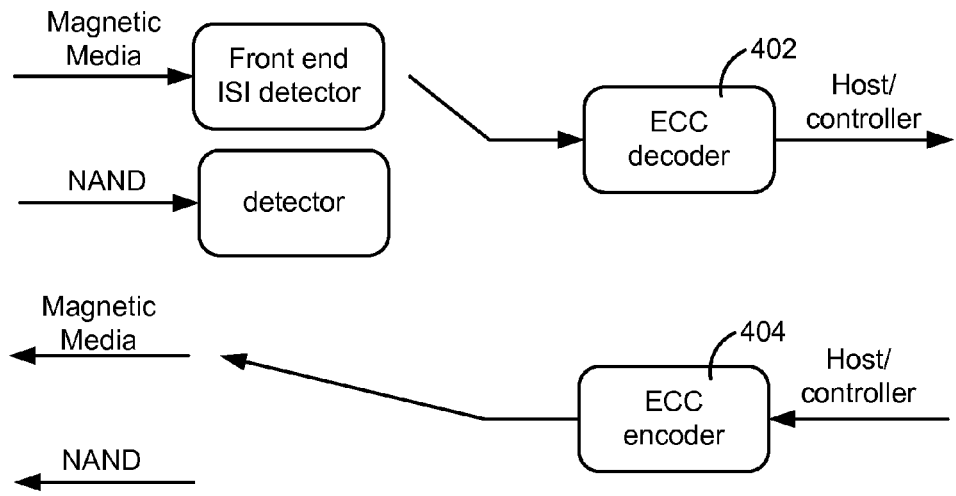
FIG. 4 is a diagram of an illustrative embodiment of selectable components for a multiuse data channel.

In some embodiments, selectable components of the data channel 102 may include an inner encoder and an inner decoder, such as in FIG. 4; an outer encoder and an outer decoder; an EDC encoder and an EDC decoder; or a combination of an inner code, outer code, and EDC code. Also, one or more detectors may be selectable components. More examples of selectable components are provided below.

Figure 5:
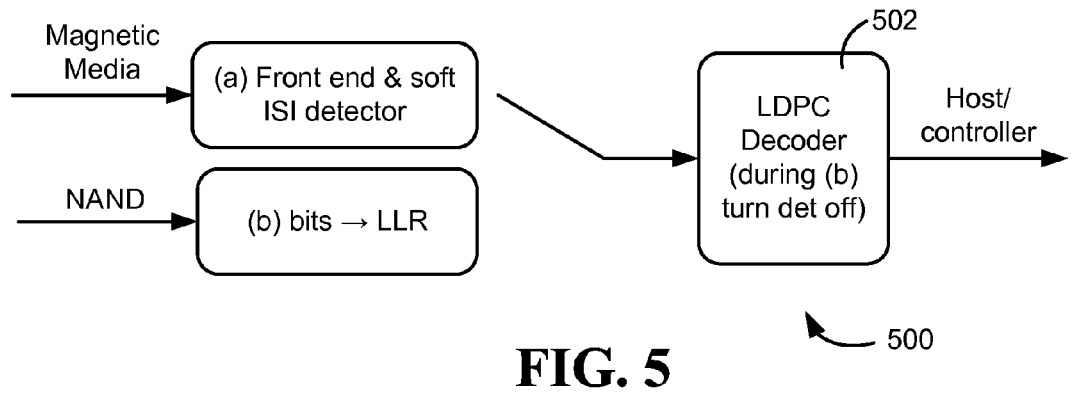
FIG. 5 is a diagram of another illustrative embodiment of selectable components for a multiuse data channel.

In embodiments having an inner code, a common ECC decoder could be a multi-purpose inner low-density parity check (LDPC) decoder, such as in FIG. 5, and there can also be a corresponding multi-purpose encoder. Further, an embodiment with a multi-purpose LDPC decoder could also have a common elastic buffer that can serve more than one type of data storage media, such as a magnetic disc and a Flash memory. Sample buffer(s) in the elastic buffer could be used for magnetic media and could also be used to enable soft information of multiple reads in solid state memory.

Figure 6:
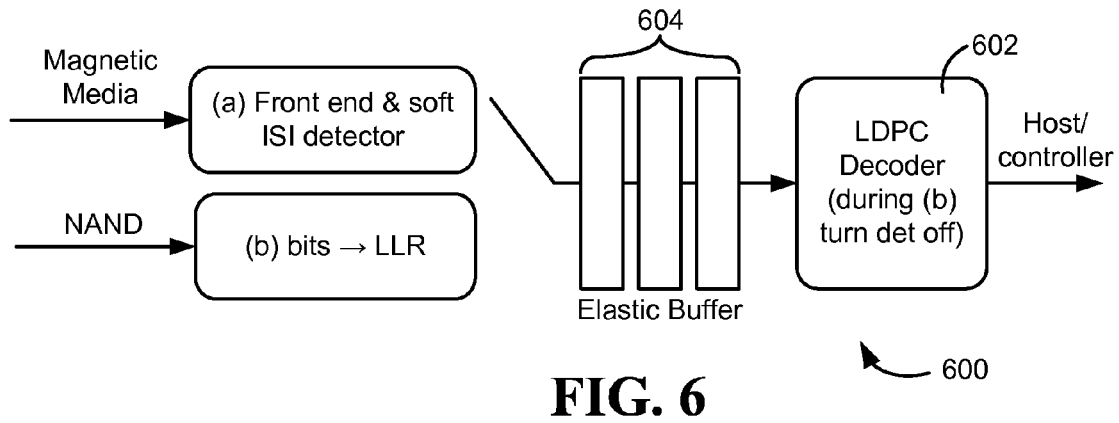
FIG. 6 is a diagram of another illustrative embodiment of selectable components for a multiuse data channel.

On embodiments having an outer code, a common ECC decoder could be a multi-purpose Reed-Solomon outer decoder, such as in FIG. 6, and there can also be a corresponding multi-purpose encoder. In some embodiments, a data channel can include an independent encoding path and an independent decoding path such that parallel encoding for one media can be performed while decoding of the other media. Both the independent encoding path and the independent decoding path can each include at least one selectable component, such as an encoder or a decoder.

Figure 7:
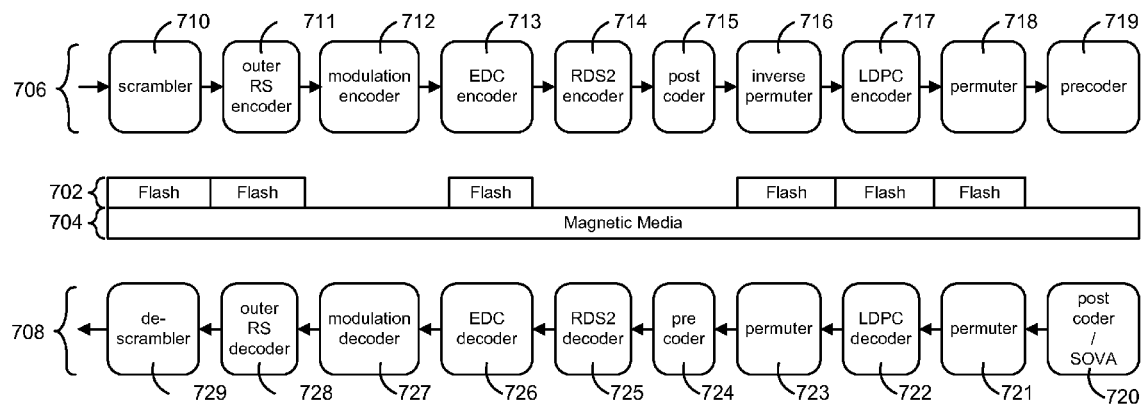
FIG. 7 is a diagram of an illustrative embodiment of a transmission channel and a receiving channel having selectable components for a multiuse data channel.

In embodiments having an EDC code, a common EDC decoder could be a multi-purpose CRC decoder, such as in FIG. 7, and there can also be a corresponding multi-purpose encoder. Also, some embodiments, such as in FIG. 7, could include a common scrambler circuitry. In embodiments having a combination of an inner code and an outer code, such as in FIG. 7, the multi-purpose inner decoder could be an LDPC decoder and the multi-purpose outer decoder could be a Reed-Solomon decoder; there may also be corresponding multi-purpose encoders.

In yet another example, a circuit can include a data channel having selectable components where the data channel can be adapted (or configured) to process data having at least two different channel processing requirements. The circuit can also include a control circuit to select a channel configuration of the selectable components from multiple unique channel configurations. The data channel can further include an independent encoding path and an independent decoding path to allow parallel processing of data through the independent encoding path and the independent decoding path. Both the independent encoding path and the independent decoding path can each include at least one selectable component in common. The independent decoding path can further include a selectable component including a first detector, where the first detector is selected to be included in a first channel configuration and is not selected to be in a second channel configuration. The first detector may be a soft detector that uses a log likelihood ratio. The circuit may include multiple unique channel configurations based on at least one data signal characteristic.

Figure 2:
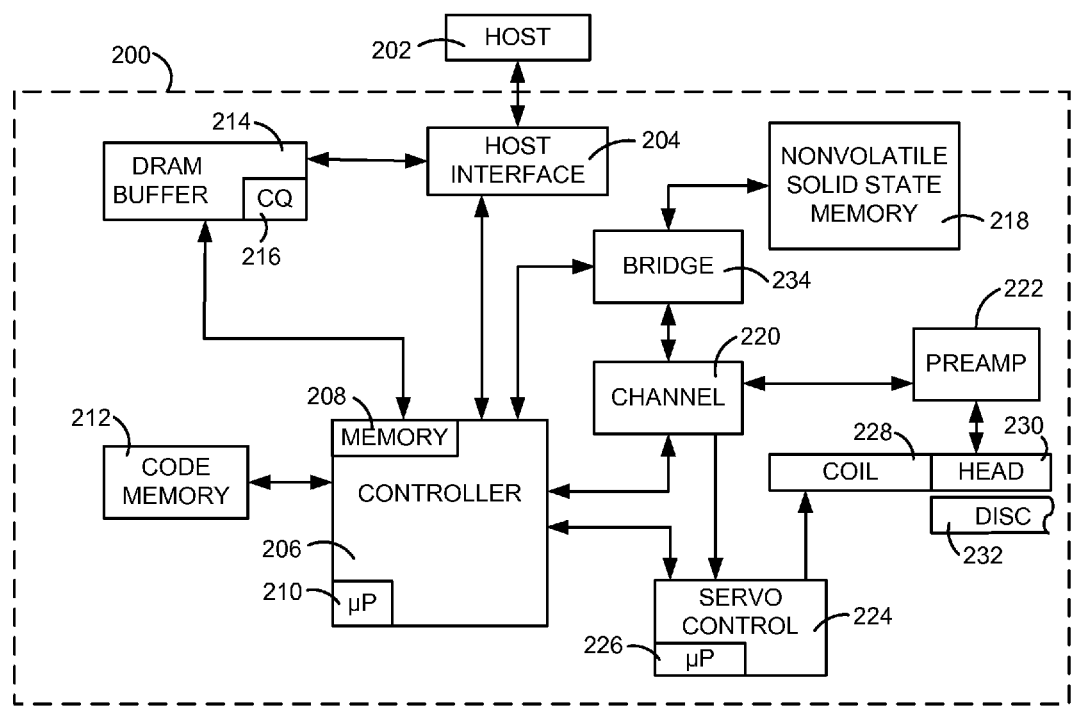
FIG. 2 is a diagram of an illustrative embodiment of a data storage system with a multiuse data channel.

Referring to FIG. 2, an embodiment of a system for a multiuse data channel is shown and generally designated 200. The data storage device 200 can communicate with a host device 202 via an interface 204 that may include a connector that allows the data storage device 200 to be physically removed from the host 202. The interface 204 may include hardware circuits, logic, firmware, or any combination thereof. In a particular embodiment, the interface 204 comprises an interface that allows attachment of a data storage device to another computer system, such as USB, IEEE 1394, Compact Flash, SATA, eSATA, PATA, SCSI, SAS, or Fiber Channel. The data storage device 200 may be internal or external to an enclosure of the host 202.

The data storage device 200 can include a programmable controller 206 with associated memory 208 and processor 210. The programmable controller 206 may be coupled to a memory 212 and buffer 214. The memory 212 may be a nonvolatile solid state memory, such as Serial Flash, that is capable of storing firmware code, or boot code, to allow the controller to perform functions of the data storage device 200, such as a spin-up sequence for the disc 232. The buffer 214 can temporarily store user data during read and write operations and can include a command queue (CQ) 216 where multiple pending access operations can be temporarily stored pending execution. The CQ 216 may be located in a nonvolatile memory or a volatile memory.

Further, FIG. 2 further shows the data storage device 200 to include a read/write (R/W) channel 220 which can encode data during write operations and reconstruct data during read operations to/from a nonvolatile solid state memory 218 and the disc(s) 232. A preamplifier/driver circuit (preamp) 222 can apply write currents to the head(s) 230 and provide preamplification of readback signals. A servo control circuit 224 can use servo data to provide the appropriate current to the coil 228 to position the head(s) 230. The controller 206 can communicate with a processor 226 to move the head(s) 230 to the desired locations on the disc(s) 232 during execution of various pending commands in the command queue 216. The data storage device 200 may also include a bridge circuit 234 or control module to facilitate writing and reading of data to the nonvolatile state memory 218.

The data storage device 200 may be referred to as a hybrid data storage device or hybrid disc drive. A hybrid data storage device may have two different types of nonvolatile data storage mediums for storage of data, such as user data received from the host 202. In some instances, a first logical block address (LBA) range may be associated with the nonvolatile solid state memory 218 and a second non-overlapping LBA range may be associated with the disc(s) 232. Further, all or part of the nonvolatile solid state memory 218 may be used as a cache, such as a write cache or read cache or both. In some hybrid data storage devices, an storage capacity of the nonvolatile solid state memory 218 may be small compared to the storage capacity of the disc(s) 232. Thus, a number of dies needed to implement the nonvolatile solid state memory 218 may be small, such as one or two dies. A die, in the context of integrated circuits, can be an area of semiconducting material on which a circuit may be fabricated. While a hybrid data storage device may implement separate channel components (such as decoders and encoders) for each data storage medium, a cost associated with the dedicated channel components can be high when considering they may only be used for a relatively small amount of storage space. Thus, as discussed herein, some embodiments may include a channel with selectable components that could be used for each type of data storage medium. Such as solution, especially when applied to MLC NAND, can provide a more reliable nonvolatile solid state memory solution without an additional cost of having dedicated channel components.

During operation, the controller 206 may be configured to read and write data to the nonvolatile solid state memory 218 and the disc(s) 232 using the channel 220. The controller 206 or the channel 220 may have selection logic (not shown) to select components (hardware circuits, software modules, or a combination thereof) of the channel 220 based on data signal characteristics of which data storage medium is associated with data being read or written. Different channel processing, such as various ECC, may be implemented for data with different signal characteristics, which may vary based on a type of storage media. However, some of the components of the channel 220 may be selected to be applied for both of the data storage mediums. Thus, a first combination of selectable components of the channel 220 may be applied when processing data through the channel 220 for the nonvolatile solid state memory 218 and a second combination of selectable components of the channel 220 may be applied when processing data through the channel 220 for the disc(s) 232. The first combination and the second combination may have one or more selectable components in common.

Figure 3:
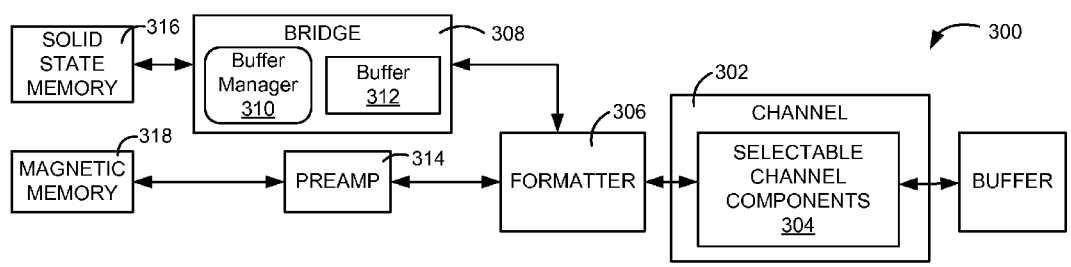
FIG. 3 is a diagram of another illustrative embodiment of a data storage system with a multiuse data channel.

Referring to FIG. 3, an embodiment of a system for a multiuse data channel is shown and generally designated 300. The system 300 may include a channel 302 having selectable channel circuits 304 and a formatter 306. The formatter 306 may be part of the channel circuits 304 or may be a separate circuit. The system may also include a bridge 308 that may have a buffer manager 310 and buffer 312 that is adapted to facilitate the transfer of data between the channel 302 and a solid state memory 316. Further, the system 300 may include a preamp to facilitate the transfer of data between a magnetic memory 318 and the channel 302.

The bridge 308 is optional and may not be needed if a controller or channel is adapted to communicate with the solid state memory 316 directly. However, in some instances, the channel 302 and an associated controller (not shown) may be primarily designed to store data at the magnetic memory 318 and the bridge 308 can provide additional buffer 312 and control logic 310, in the form of a buffer manager, to transfer data between the channel 302 and the solid state memory 316.

The selectable channel circuits 304 (which may be any combination of hardware and software) may be selected via a control circuit (not shown) or a controller (not shown) that is adapted to implement selection of the selectable components based on one or more factors, such as which data storage medium data is to be stored to or retrieved from.

The data storage mediums 316 and 318 may have different data signal characteristics, which may be due to differing properties of the data storage mediums, differing data densities, differing data throughput, or other characteristics. For example, a magnetic disc data storage medium may have errors due to inter-symbol-interference (ISI) and a MLC Flash may have different reliability issues, such as due to MLC Flash yielding more than one bit of information per cell which can reduce an amount of margin separating states and result in more errors. Further, in a Flash memory and other solid state memories, program-erase cycles can degrade a memory cell. Also, errors may be due to elongated times between when a cell is refreshed or due to program/write disturbs from writing of nearby or adjacent cells. In an example where a whole die may fail for an MLC Flash, an outer code may be used to try to correct the errors.

The control circuit may then select components of the channel 302 to implement during data processing of the channel based on which data storage medium the data to be processed is associated with. Some selectable components of the channel 302 may be selected to be used in conjunction with both data storage mediums.

Referring to FIG. 4, an embodiment of a system for a multiuse data channel is shown and generally designated 400. FIG. 4 generally shows a decoder 402 and an encoder 404 that may be selected to be used for differing data storage mediums, such as a magnetic medium and a solid state memory, such as NAND Flash. The decoder 402 and the encoder 404 may be hardware circuits (such as within an Application Specific Integrated Circuit (ASIC)), software modules, or any combination thereof.

Referring to FIG. 5, an embodiment of a system for a multiuse data channel is shown and generally designated 500. FIG. 5 generally shows a decoder 502, which may be a low-density parity check (LDPC) decoder, that may be selected to be used for differing data storage mediums, such as a magnetic medium and a solid state memory, such as NAND Flash. The decoder 502 may be a hardware circuit (such as within an ASIC), a software module, or any combination thereof.

LDPC inner codes can be used to provide error correction capabilities for both magnetic media and solid state memory, such as Flash. When using a same number of parity bits, an LDPC inner code can provide better error correction capabilities than a Reed-Solomon code used for a magnetic medium, as well as better error correction capabilities than a BCH code used for a NAND Flash. Thus, an LDPC encoder and an LDPC decoder may be implemented in a hybrid data storage device for both a magnetic data storage medium and a solid state data storage medium, such as NAND Flash. Specific LDPC codes do not have to be the same for the magnetic data storage medium and the solid state data storage medium, the hardware for an LDPC encoder or LDPC decoder can be configurable to implement different codeword sizes, code rates, or code structures.

In a magnetic data storage medium, there can be memory between adjacent bits which may be referred to as inter-symbol interference (ISI) and in a Flash memory there may be little or no memory between bits. As a result, for magnetic data storage mediums, a detector, such as Viterbi or BCJR detector, may be used to remove the ISI, whereas in a Flash memory a detector may be a simple bit based system.

Thus, for a magnetic data storage medium, an LDPC decoder can be implemented as an iterative process where a codeword may be successfully decoded after multiple iterations between the detector and the decoder. For a Flash memory, iterations with the detector may not be needed. Therefore, a feedback detector can be turned off when processing data from a Flash memory as shown in FIG. 2.

Referring to FIG. 6, an embodiment of a system for a multiuse data channel is shown and generally designated 600. The system 600 can include a decoder 602, which may be a LDPC decoder, that may be selected to be used for differing data storage mediums, such as a magnetic medium and a solid state memory, such as NAND Flash. The decoder 602 may be a hardware circuit (such as within an ASIC), a software module, or any combination thereof.

The system 600 may also include an elastic buffer 604, which may be adapted to store data related to the channel, such as log likelihood ratio (LLR) values or signal values. The elastic buffer(s) 604 may be used to optimize the flow of data from a data storage medium to the decoder 602. For example, a solid state memory, such as NAND Flash, may act as a slave to controller such that even when data is available, the controller decides when to load the data into the decoder. In FIG. 5, the LDPC decoder 502 may be busy decoding codewords from the magnetic media, the available pages on the solid state memory need to wait until the LDPC decoder is free, at which point an available page(s) can be loaded into the LDPC decoder. To improve the performance of such a system, the elastic buffer 604 can be used for codewords from the magnetic media and the solid state memory. Then, data from the solid state memory could be loaded while the decoder is decoding data from the magnetic media. Using elastic buffers allow codewords that need more iterations than an allocated iteration amount to borrow iterations from other codewords that need less iterations.

On some examples, the system 600 may implement two elastic buffers (not shown), one to hold LLR values for the detector and one to hold the sample values for the decoder input. If an incoming codeword is from a Flash memory, the detector may not be used. A decoder output and detector output may both be in the LLR domain. For a solid state memory, the detector in the LLR domain may not be needed.

However, for multiple reads or a soft read, both elastic buffers could be used for additional storage space for sample values for the solid state memory.

The LDPC decoder 602 may be designed to handle a continuous stream of data. The LDPC decoder 602 may also be designed to be detached, separately operable, from an LDPC encoder; then, simultaneous read and write operations can be supported. Parallelism may also be implemented to increase a decoding bandwidth of the LDPC decoder and associated buffers.

Referring to FIG. 7, an embodiment of a system for a multiuse data channel is shown and generally designated 700. The system 700 may include a first data storage medium 702, such as Flash memory, a second data storage medium 704, such as magnetic media, a write channel 706, and a read channel 708. The write channel 706 and the read channel 708 may be include selectable components (such as hardware circuits, software modules, or both) adapted to process data for both the first data storage medium 702 and the second data storage medium 704.

The write channel 706 may include selectable components 710-719. In some embodiments, the write channel may utilize selectable components 710, 711, 713, 716, 717, and 718 when processing data to be stored at the first data storage medium 702 and the write channel may utilize selectable components 710, 711, 712, 713, 714, 715, 716, 717, 718, and 719 when processing data to be stored to the second data storage medium 704.

The read channel 708 may include selectable components 720-729. In some embodiments, the read channel may utilize selectable components 721, 722, 723, 728, and 729 when processing data from the first data storage medium 702 and the read channel may utilize selectable components 720, 721, 722, 723, 724, 725, 726, 727, 728, and 729 when processing data from the second data storage medium 704.

An example of a modulation code that could be implemented in modulation encoder 712 or modulation decoder 727 may be a running digital sum (RDS). In further examples, an outer code can have a capability of correcting a single or more failed inner codes. An outer code can be used for magnetic data storage media but may suffer from performance loss due to a read modify write system. In some systems, such as sequential writing systems, outer codes may not suffer performance loss if data is mostly sequentially written. An outer code can also be used for a solid state memory, such as a NAND Flash memory, to protect against page, block, die, or package failures, in some applications.

FIG. 7 illustrates an example where a single outer code can correct errors from both magnetic media and solid state media, such as NAND Flash memory. For example, for a magnetic media, such as a magnetic disc, precoding and postcoding can be done to minimize ISI and modulation codes could be implemented to mitigate ISI and help timing recovery, whereas for data stored in the solid state memory these operations can be bypassed.

While specific examples of which components may apply to two different data storage mediums, one skilled in the art should recognize that the selectable components of the read path and the write path may change. Selectable components may be removed or other selectable components may be added to the write channel 706 or the read channel 708.

In accordance with various embodiments, the systems and methods described herein may be implemented as one or more software programs running on a computer processor or controller, such as the channel 102, the selection logic 110, the controller 206, the channel 220, or the channel 302. Dedicated hardware implementations including, but not limited to, application specific integrated circuits, programmable gate arrays, and other hardware devices can likewise be constructed to implement the systems, components, and methods described herein. The systems and methods described herein can be applied to any type of data channel that has a need to process data with varying characteristics.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

The illustrations and examples provided herein are but a few examples of how the present disclosure can be applied to data storage systems. There are many other contexts in which the methods and systems described herein could be applied to communication systems, computing systems, and data storage systems. For example, the systems and methods described herein are particularly useful for communication systems to process multiple data types.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:

1. A system comprising:
    a first data storage medium having a first set of characteristics including at least one of a transmission method, a storage medium, a data compression, an error correction capability, a data density, a data error, and a data throughput;
    a second data storage medium having a second set of characteristics including at least one of a transmission method, a storage medium, a data compression, an error correction capability, a data density, a data error, and a data throughput, the second set of characteristics different from the first set of characteristics;
    a data channel coupled to the first data storage medium and the second data storage medium, the data channel including a selectable component configured to perform one of an encode operation and a decode operation; and
    selection logic to control the selectable component to be included for processing data in the data channel for the first data storage medium and excluded for processing data in the data channel for the second data storage medium, the selection logic configured to include and exclude the selectable component in the data channel based on one of the first set of characteristics and the second set of characteristics.

2. The system of claim 1 where the selectable component is an encoder, and the encoder is at least one of an inner encoder and an outer encoder.

3. The system of claim 1 wherein the first data storage medium is a first type of nonvolatile data storage medium and the second data storage medium is a second type of nonvolatile data storage medium and the data channel is configurable to read and write data to both the first data storage medium and the second data storage medium.

4. The system of claim 1 wherein the data channel further includes an independent encoding path and an independent decoding path, and the independent encoding path includes the selectable component and the independent decoding path includes another selectable component.

5. The system of claim 1, wherein the first data storage medium is coupled to the data channel by a first portion of a first data path and the second data storage medium is coupled to the data channel by a second portion of a second data path.

6. The system of claim 5, wherein the first portion of the first data path comprises a first buffer and a first buffer manager, the first buffer and the first buffer manager configured to transfer data between the data channel and the first data storage medium.

7. The system of claim 6, further comprising a formatter positioned in the first data path, the formatter coupling the first data storage medium and the second data storage medium to the data channel and configured to format first data from the first storage medium for processing in the data channel.

8. The system of claim 7, further comprising a second buffer coupled to the data channel and configured to receive data from the data channel.

9. The system of claim 1, wherein the selectable component is at least one of an encoder, a scrambler, a coder, a permuter, and a precoder.

10. The system of claim 1, wherein the selectable component is at least one of a decoder, a descrambler, a decoder, a permuter, and a postcoder.

11. A system comprising:
a first data storage medium;
a second data storage medium;
a read/write channel including at least one selectable component to process data for one of the first data storage medium and the second data storage medium, the read/write channel coupled to the first data storage medium and the second data storage medium; and
selection logic configured to include the at least one selectable component for processing data for the first data storage medium and to exclude the at least one selectable component for processing data for the second data storage medium.

12. The system of claim 11 where the read/write channel includes a first channel configuration of a first set of components and a second channel configuration of a second set of components, the first set of components comprising an encoder component and the second set of components not comprising the encoder component.

13. The system of claim 11, wherein the read/write channel comprises multiple selectable components, a first channel configuration of the read/write channel including a first set of the multiple selectable components included for processing data for the first data storage medium, and a second channel configuration of the read/write channel excluding the first set of the multiple selectable components for processing data for the second data storage medium.

14. The system of claim 13, wherein the first data storage medium is a disc data storage medium and the second data storage medium is a nonvolatile solid state data storage medium, and the read/write channel is configured to process data for the disc data storage medium using the first channel configuration and to process data for the nonvolatile solid state data storage medium using the second channel configuration.

15. The system of claim 14, the first set of the multiple selectable components comprising:
a modulation encoder;
a running digital sum (RDS) encoder;
a post coder; and
a precoder.

16. The system of claim 14, the first set of the multiple selectable components comprising:
a post coder;
a precoder;
a running digital sum (RDS) decoder; and
a modulation decoder.

17. An error correction channel comprising:
a selectable decoding component that is included to process data in a first channel configuration and is excluded when data is processed in a second channel configuration; and
selection logic adapted to include and exclude the selectable decoding component when the error correction channel is processing data such that the selectable decoding component is included when decoding data in the first channel configuration and is excluded when decoding data in the second channel configuration, the first channel configuration based on first characteristics of a first storage medium and the second channel configuration based on second characteristics of a second storage medium, the second characteristics different from the first characteristics.

18. The error correction channel of claim 17 further comprising an independent encoding path and an independent decoding path, the independent decoding path comprising the selectable decoding component.

19. The error correction channel of claim 18, wherein the independent encoding path comprises a selectable encoding component.

20. The error correction channel of claim 17 further comprising:
a first data storage medium coupled to the error correction channel and including data; and
a second data storage medium coupled to the error correction channel and including data.

21. The error correction channel of claim 20, wherein the error correction channel comprises multiple selectable components, the first channel configuration of the error correction channel including a first set of the multiple selectable components included for processing data for the first data storage medium, and the second channel configuration of the error correction channel excluding the first set of the multiple selectable components for processing data for the second data storage medium.

22. The error correction channel of claim 21, wherein the first data storage medium is a disc data storage medium and the second data storage medium is a nonvolatile solid state data storage medium, and the error correction channel is configured to process data for the disc data storage medium using the first channel configuration and to process data for the nonvolatile solid state data storage medium using the second channel configuration.

* * * * *